(12) United States Patent
Johnson

(10) Patent No.: US 11,805,331 B2
(45) Date of Patent: Oct. 31, 2023

(54) IMAGE SENSORS HAVING HIGH DYNAMIC RANGE IMAGING PIXELS

(71) Applicant: SEMICONDUCTOR COMPONENTS INDUSTRIES, LLC, Phoenix, AZ (US)

(72) Inventor: Richard Scott Johnson, Boise, ID (US)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

(21) Appl. No.: 17/813,868

(22) Filed: Jul. 20, 2022

(65) Prior Publication Data

US 2022/0360728 A1 Nov. 10, 2022

Related U.S. Application Data

(63) Continuation of application No. 16/185,139, filed on Nov. 9, 2018, now Pat. No. 11,431,926.

(51) Int. Cl.
*H01L 27/146* (2006.01)
*H04N 25/62* (2023.01)
(Continued)

(52) U.S. Cl.
CPC ....... *H04N 25/59* (2023.01); *H01L 27/14656* (2013.01); *H04N 23/54* (2023.01); *H04N 23/741* (2023.01); *H04N 25/583* (2023.01); *H04N 25/62* (2023.01); *H04N 25/709* (2023.01); *H04N 25/71* (2023.01); *H04N 25/745* (2023.01); *H04N 25/771* (2023.01)

(58) Field of Classification Search
CPC . H04N 25/771; H04N 25/62; H01L 27/14656
See application file for complete search history.

(56) References Cited

U.S. PATENT DOCUMENTS 9,900,481 B2 2/2018 Geurts et al.
2008/0036888 A1* 2/2008 Sugawa ............... H04N 5/2355
348/294

(Continued)

FOREIGN PATENT DOCUMENTS

CN 105791715 A 7/2016

OTHER PUBLICATIONS

Velichko, U.S. Appl. No. 15/791,626, filed Oct. 24, 2017.

*Primary Examiner* — Thanh Luu
(74) *Attorney, Agent, or Firm* — Treyz Law Group, P.C.; Joseph F. Guihan

(57) ABSTRACT

A high dynamic range imaging pixel may include a photodiode that generates charge in response to incident light. When the generated charge exceeds a first charge level, the charge may overflow through a first transistor to a first storage capacitor. When the generated charge exceeds a second charge level that is higher than the first charge level, the charge may overflow through a second transistor. The charge that overflows through the second transistor may alternately be coupled to a voltage supply and drained or transferred to a second storage capacitor for subsequent readout. Diverting more overflow charge to the voltage supply may increase the dynamic range of the pixel. The amount of charge diverted to the voltage supply may therefore be updated to control the dynamic range of the imaging pixel.

19 Claims, 9 Drawing Sheets

(51) Int. Cl.
*H04N 25/771* (2023.01)
*H04N 25/59* (2023.01)
*H04N 23/54* (2023.01)
*H04N 23/741* (2023.01)
*H04N 25/71* (2023.01)
*H04N 25/583* (2023.01)
*H04N 25/709* (2023.01)

(56) References Cited

U.S. PATENT DOCUMENTS

| | | |
|---|---|---|
| 2009/0045319 A1* | 2/2009 | Sugawa ............. H04N 5/37452 250/208.1 |
| 2012/0193516 A1 | 8/2012 | Bogaerts |
| 2016/0088251 A1 | 3/2016 | Luo et al. |
| 2016/0100113 A1 | 4/2016 | Oh et al. |
| 2016/0343751 A1 | 11/2016 | Sze et al. |
| 2017/0099423 A1 | 4/2017 | Cremers et al. |
| 2017/0099446 A1 | 4/2017 | Cremers et al. |
| 2017/0257578 A1* | 9/2017 | Velichko ........... H01L 27/14643 |
| 2017/0289473 A1 | 10/2017 | Lule et al. |
| 2017/0347047 A1 | 11/2017 | Mao et al. |
| 2017/0350755 A1 | 12/2017 | Geurts |
| 2018/0115730 A1 | 4/2018 | Velichko |
| 2018/0227516 A1* | 8/2018 | Mo ................... H01L 27/14609 |
| 2019/0281238 A1 | 9/2019 | Kalgi |
| 2019/0356872 A1* | 11/2019 | Manabe ................ H04N 5/353 |
| 2020/0195870 A1 | 6/2020 | Shim et al. |

\* cited by examiner

IMAGE SENSORS HAVING HIGH DYNAMIC RANGE IMAGING PIXELS

This application is a continuation of U.S. patent application Ser. No. 16/185,139, filed Nov. 9, 2018, which is hereby incorporated by reference herein in its entirety.

BACKGROUND

This relates generally to imaging devices, and more particularly, to imaging devices having high dynamic range imaging pixels.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typical image pixels contain a photodiode for generating charge in response to incident light. Image pixels may also include a charge storage region for storing charge that is generated in the photodiode. Image sensors can operate using a global shutter or a rolling shutter scheme. In a global shutter, every pixel in the image sensor may simultaneously capture an image, whereas in a rolling shutter each row of pixels may sequentially capture an image.

Some conventional image sensors may be able to operate in a high dynamic range (HDR) mode. HDR operation may be accomplished in image sensors by assigning alternate rows of pixels different integration times. However, conventional image sensors may sometimes experience lower than desired resolution, lower than desired sensitivity, higher than desired noise levels, and lower than desired quantum efficiency.

It would therefore be desirable to be able to provide improved high dynamic range operation in image sensors.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
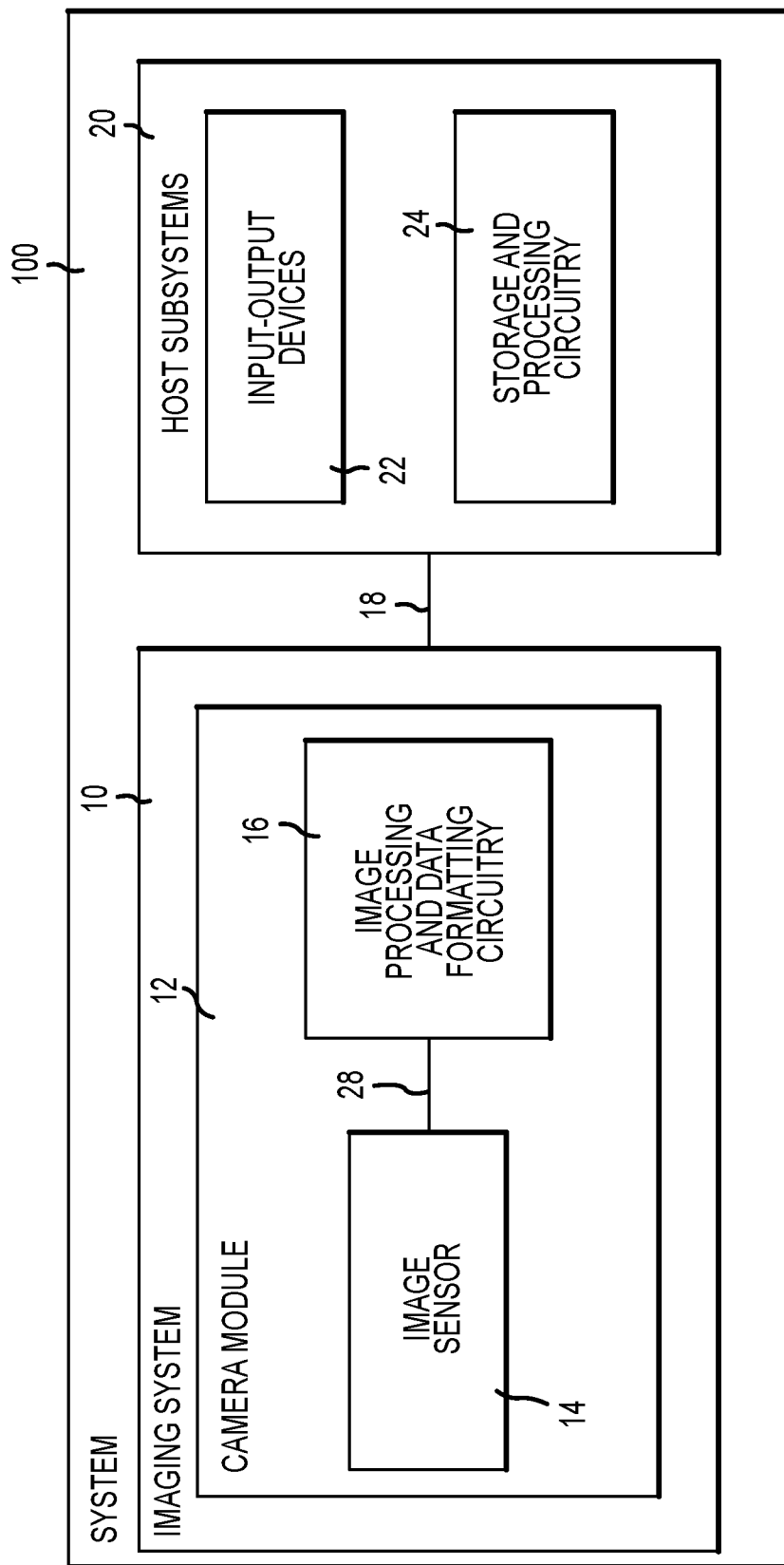
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
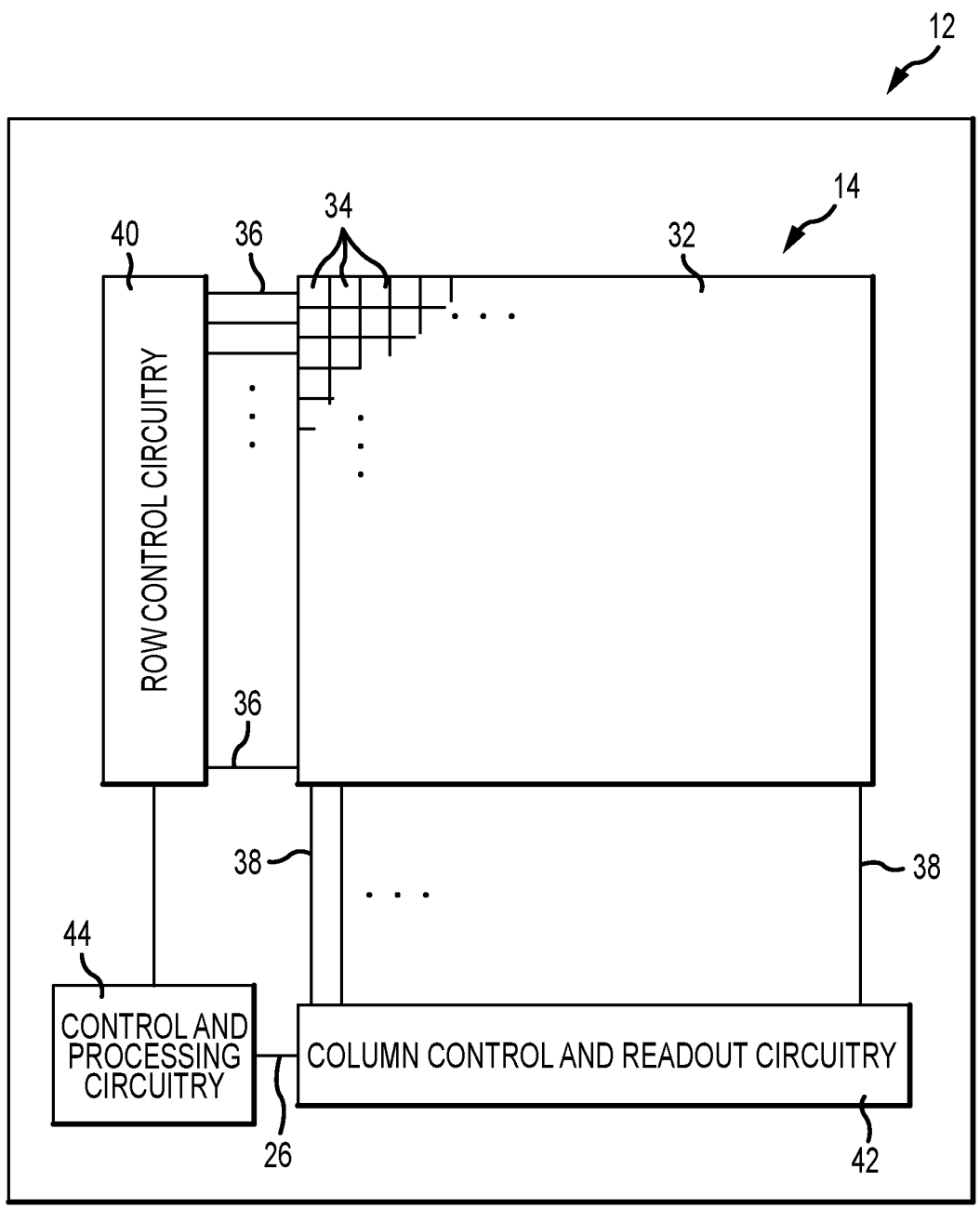
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels, imaging pixels, or image pixels 34) and may also include control circuitry 40 and 42. Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 34.

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source follower transistor and a row select transistor, or any other desired node of the pixel circuit.

In general, array 32, row control circuitry 40, column control and readout circuitry 42, and control and processing circuitry 44 may be split between two or more stacked substrates. In one example, array 32 may be formed in a first substrate and row control circuitry 40, column control and readout circuitry 42, and control and processing circuitry 44 may be formed in a second substrate. In another example, array 32 may be split between first and second substrates (using one of the pixel splitting schemes described above) and row control circuitry 40, column control and readout circuitry 42, and control and processing circuitry 44 may be formed in a third substrate.

To increase high dynamic range in imaging pixels, imaging pixels may be formed with an overflow capacitor. The photodiode for the imaging pixel generates charge. After the charge exceeds a certain level, the excess charge may overflow the photodiode into a storage capacitor. The charge from both the storage capacitor and the photodiode may be read out after the integration time is complete. This effectively increases the dynamic range of the pixel. The storage capacitor in these types of pixels may be referred to as an overflow capacitor.

Figure 3:
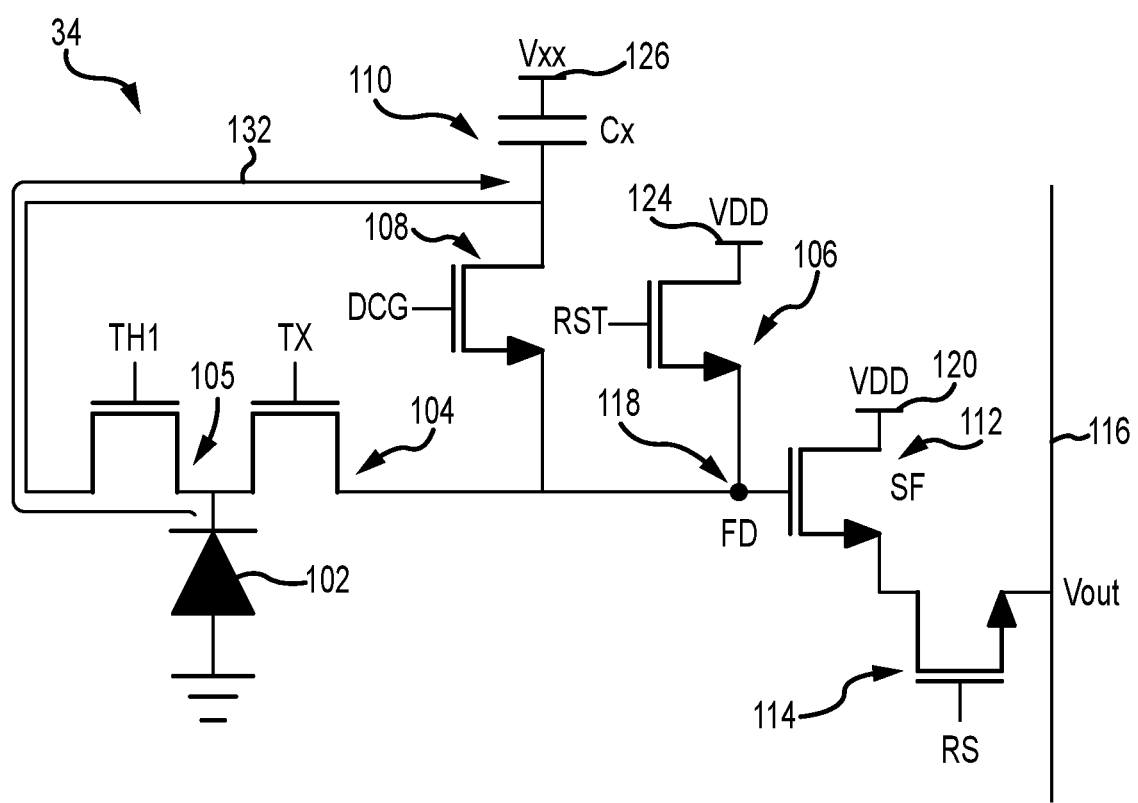
FIG. 3 is a circuit diagram of an illustrative imaging pixel that includes an overflow capacitor in accordance with an embodiment.

FIG. 3 is a circuit diagram of an imaging pixel having a photosensitive element and a storage capacitor. As shown in FIG. 3, image pixel 34 includes photosensitive element 102 (e.g., a photodiode). Photosensitive element 102 has a first terminal that is coupled to ground. The second terminal of photosensitive element 102 is coupled to transfer transistor 104 and transistor 105. Transfer transistor 104 is coupled to floating diffusion (FD) region 118. Transistor 105 (sometimes referred to as threshold transistor 105) is coupled between photodiode 102 and storage capacitor 110. A reset transistor 106 may be coupled between floating diffusion region 118 and voltage supply 124. Voltage supply 124 may provide a voltage VDD. Floating diffusion region 118 may be a doped semiconductor region (e.g., a region in a silicon substrate that is doped by ion implantation, impurity diffusion, or other doping process). Floating diffusion 118 has an associated capacitance. Gain select transistor 108 has a first terminal coupled to floating diffusion region 118 and a second terminal coupled to storage capacitor 110 (Cx). Dual conversion gain capacitor 110 may have a first plate 110-1 (sometimes referred to as an upper plate or top plate) coupled to the second terminal of the gain select transistor. Dual conversion gain capacitor 110 may have a second plate 110-2 (sometimes referred to as a lower plate or bottom plate) that is coupled to voltage supply 126. Voltage supply may provide a voltage Vxx.

Source follower transistor 112 has a gate terminal coupled to floating diffusion region 118 and a first terminal of reset transistor 106. Source follower transistor 112 also has a first source-drain terminal coupled to voltage supply 120. Voltage supply 120 may provide a power supply voltage VDD. The power supply voltage at power supplies 120 and 124 may be the same or may be different. In this application, each transistor is illustrated as having three terminals: a source, a drain, and a gate. The source and drain terminals of each transistor may be changed depending on how the transistors are biased and the type of transistor used. For the sake of simplicity, the source and drain terminals are referred to herein as source-drain terminals or simply terminals. A second source-drain terminal of source follower transistor 112 is coupled to column output line 116 through row select transistor 114. The source follower transistor, row select transistor, and column output line may sometimes collectively be referred to as a readout circuit or as readout circuitry.

A gate terminal of transfer transistor 104 receives control signal TX. A gate terminal of threshold transistor 105 receives control signal TH1. A gate terminal of gain select transistor 108 receives control signal DCG. A gate terminal of reset transistor 106 receives control signal RST. A gate terminal of row select transistor 114 receives control signal RS. Control signals TX, DCG, RST, RS, and TH1 may be provided by row control circuitry (e.g., row control circuitry 40 in FIG. 2) over control paths (e.g., control paths 36 in FIG. 2).

Gain select transistor 108 and dual conversion gain capacitor 110 may be used by pixel 34 to implement a dual conversion gain mode. In particular, pixel 34 may be operable in a high conversion gain mode and in a low conversion gain mode. If gain select transistor 108 is disabled, pixel 34 will be placed in a high conversion gain mode. If gain select transistor 108 is enabled, pixel 34 will be placed in a low conversion gain mode. When gain select transistor 108 is turned on, the dual conversion gain capacitor 110 may be switched into use to provide floating diffusion region 118 with additional capacitance. This results in lower conversion gain for pixel 34. When gain select transistor 108 is turned off, the additional loading of the capacitor is removed and the pixel reverts to a relatively higher pixel conversion gain configuration.

To allow overflow of charge from photodiode 102 to storage capacitor 110 and increase dynamic range, control signal TH1 for threshold transistor 105 may be set to an intermediate voltage level during the integration time. When the charge levels in photodiode 102 exceed a given level (set by control signal TH1), charge may overflow into capacitor 110. For example, the overflow charge may follow path 132. This example is merely illustrative, and control signal TX for transfer transistor 104 may instead be set to an intermediate voltage level that allows charge to pass to capacitor 110 when the charge levels exceed a given level in the photodiode.

Including storage capacitor 110 (Cx) in the imaging pixel increases the dynamic range of the pixel relative to embodiments where the storage capacitor is not included. However, the dynamic range may still be limited by the size of storage capacitor 110. For additional improvements to dynamic range, an arrangement of the type shown in FIG. 4 may be used.

Figure 4:
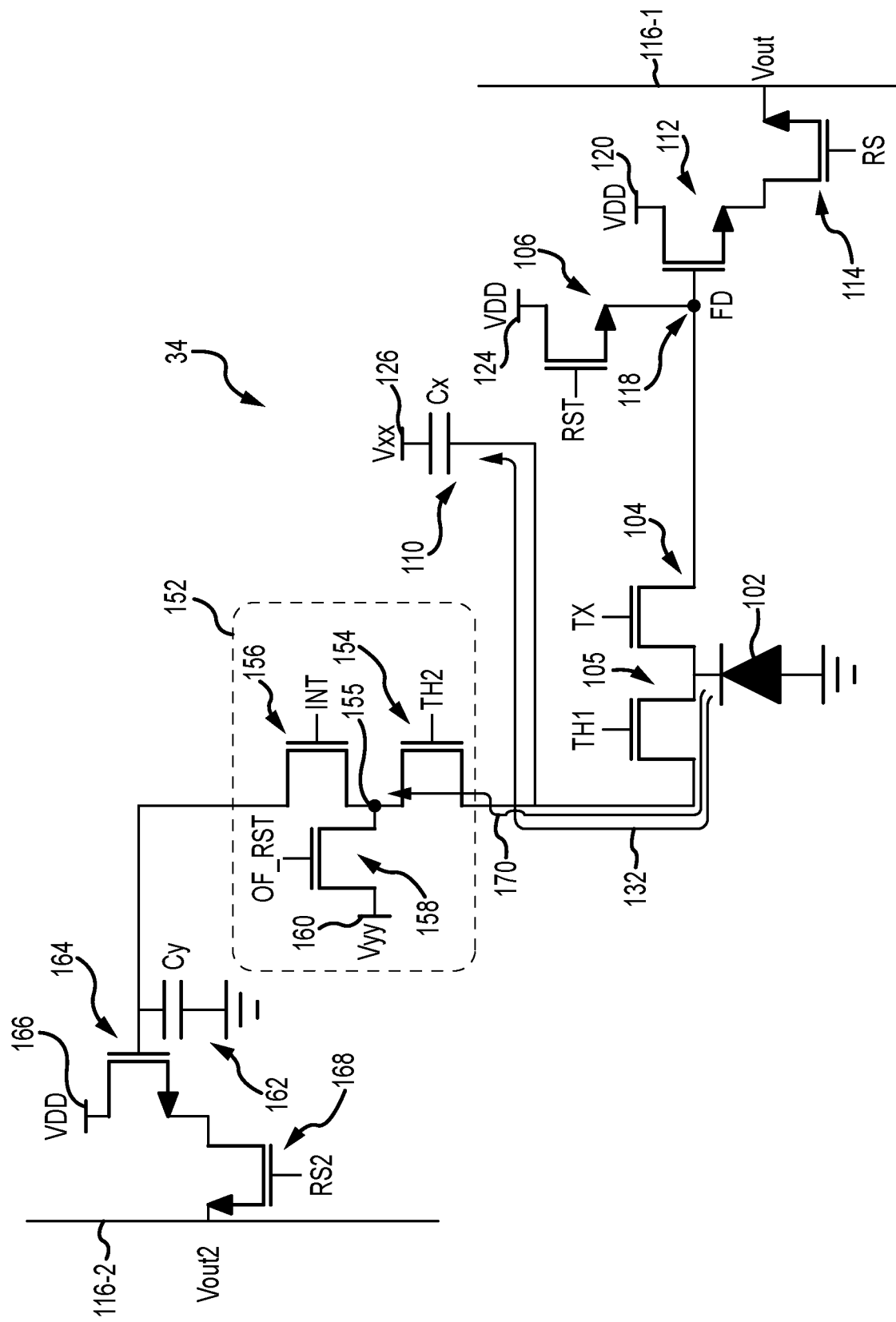
FIG. 4 is a circuit diagram of an illustrative imaging pixel that includes a first overflow capacitor and a charge directing structure that intermittently directs charge to a second overflow capacitor in accordance with an embodiment.

FIG. 4 is a circuit diagram of an illustrative imaging pixel with two charge overflow paths to further extend the dynamic range of the imaging pixel. As shown in FIG. 4, much of the pixel circuit is the same as shown in FIG. 3. Transfer transistor 104 is included between photodiode 102 and floating diffusion region 118. A reset transistor 106 is coupled between floating diffusion region 118 and voltage supply 124. The floating diffusion region is coupled to the gate of source follower transistor 112. Source follower transistor 112 is coupled between voltage supply 120 and row select transistor 114. Row select transistor 114 is coupled to a column output line. In this pixel, two column output lines are included, so the column output line coupled to row select transistor 114 is referred to as column output line 116-1.

Similar to as in FIG. 3, a transistor 105 is coupled to photodiode 102 between the photodiode and a storage capacitor 110 in FIG. 4. During the integration time of pixel 34, control signal TH1 for transistor 105 may be set to an intermediate voltage level. When the charge levels in photodiode 102 exceed a given level (set by control signal TH1), charge may overflow into capacitor 110. For example, the overflow charge may follow path 132.

In high incident light level conditions, the dynamic range of the imaging pixel may be limited by the storage capacity of storage capacitor 110 (if storage capacitor provides the only overflow charge storage as in FIG. 3). To increase the dynamic range, the pixel of FIG. 4 includes an additional storage capacitor and an additional charge overflow path to the additional storage capacitor. A coupled gate structure 152 (sometimes referred to as coupled gate 152, charge directing circuitry 152, etc.) may be used to selectively direct overflow charge to the additional storage capacitor.

Coupled gate 152 includes a first transistor 154 and second transistor 156 coupled in series (to storage capacitor 162). Coupled gate 152 also includes a reset transistor 158 that is coupled to a node 155 between transistors 154 and 156. Reset transistor 158 is coupled between node 155 and bias voltage supply terminal 160 (that supplies a voltage Vyy).

Storage capacitor 162 is coupled to the gate of an additional source follower transistor 164. Source follower transistor 164 may be coupled between voltage supply 166 (that supplies a voltage VDD) and row select transistor 168. Row select transistor 168 may be coupled to an additional column output line 116-2. When row select transistor 168 is asserted, a voltage Vout2 indicative of the amount of charge on storage capacitor 162 may be sampled onto column output line 116-2.

A gate terminal of threshold transistor 154 receives control signal TH2. A gate terminal of transistor 156 receives control signal INT. A gate terminal of transistor 158 receives control signal OF_RST. A gate terminal of transistor 168 receives control signal RS2. Transistor 156 may sometimes be referred to as an integration transistor and transistor 158 may sometimes be referred to as an overflow reset transistor.

During the integration time of pixel 34, control signal TH1 for transistor 105 and control signal TH2 for transistor 154 may both be set to respective intermediate voltage levels. When the charge levels in photodiode 102 exceed a first given level (set by control signal TH1), charge may overflow into capacitor 110 (following path 132). When the charge level (e.g., in photodiode 102 and storage capacitor 110) exceeds a second given level (for which the channel barrier of TH2 is lower than the channel barrier of TH1), charge may overflow through transistor 154 to node 155 (following path 170).

During the integration period, transistors 156 and 158 may be asserted in a mutually exclusive manner (or nearly mutually exclusive manner) to direct the overflow charge along one of two paths. Transistors 156 and 158 may be in the same state (e.g., both asserted or both deasserted) for less than 20% of the integration time, less than 10% of the integration time, less than 5% of the integration time, less than 2% of the integration time, less than 1% of the integration time, less than 0.1% of the integration time, less than 0.01% of the integration time, etc. If transistor 158 is asserted, transistor 156 will be deasserted. In this state, charge will be drained to voltage supply 160. If transistor 156 is asserted, transistor 158 will be deasserted. In this state, charge will be transferred to storage capacitor 162 (Cy). Once in the storage capacitor 162, the charge may be sampled by using source follower transistor 164, row select transistor 168, and column output line 116-2 (sometimes referred to as a readout circuit or readout circuitry).

Figure 5:
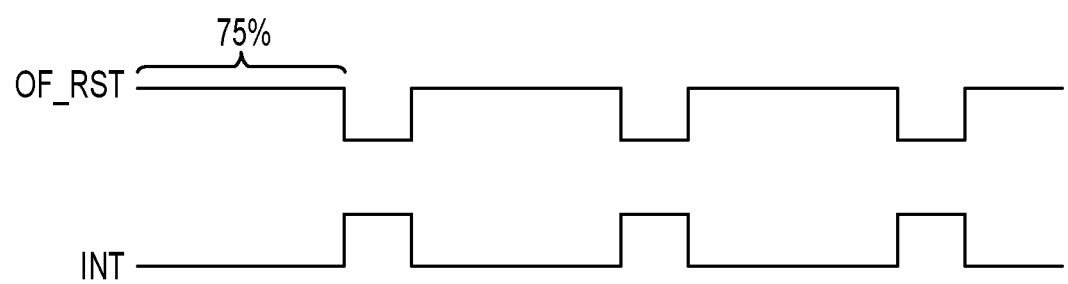
FIG. 5 is a timing diagram showing operation of an illustrative imaging pixel such as the pixel of FIG. 4 when more overflow charge is disposed of then integrated in accordance with an embodiment.

The arrangement of coupled gate 152 may allow the dynamic range of the pixel to be easily controlled by adjusting the amount of time transistors 156 and 158 are each asserted. For example, consider the timing diagram of FIG. 5. FIG. 5 shows the OF_RST control signal and INT control signal during the integration period of pixel 34. As shown, when OF_RST is high, INT is low (and vice-versa). The signals may cycle between high and low states at consistent rate. The amount of time the OF_RST signal is high in each cycle sets the dynamic range of the pixel. For example, in FIG. 5 OF_RST is high for 75% of each cycle. For the remaining 25% of the cycle, OF_RST is low (and INT is high). This means that, of the overflow charge received by coupled gate structure 152, 75% is drained to voltage supply 160 and only 25% is transferred to storage capacitor Cy. This known ratio may be used to extrapolate a detected overflow signal. In this case, for example, the amount of charge sampled from Cy may be multiplied by four (because integration was only occurring 25% of the time) to determine how much overflow charge was received by coupled gate 152. This effectively increases the storage capacity of storage capacitor 162 by four times, which improves the dynamic range of the pixel.

The frequency of asserting between OF_RST control signal and INT control signal can be controlled in a psuedo random nature in order to mitigate LED frequency gaps which could be present with a constant frequency. For example, if the OF_RST is configured to be asserted for 50% of the integration time (and the RST control signal is therefore also configured to be asserted for 50% of the integration time), the OF_RST signal could be asserted with a constant frequency (e.g., 1 millisecond asserted, then 1 millisecond deasserted, then 1 millisecond asserted, then 1 millisecond deasserted, etc.). Alternatively, the duration of each assertion and deassertion may vary across the integration time while still totaling 50% of the integration time.

Figure 6:
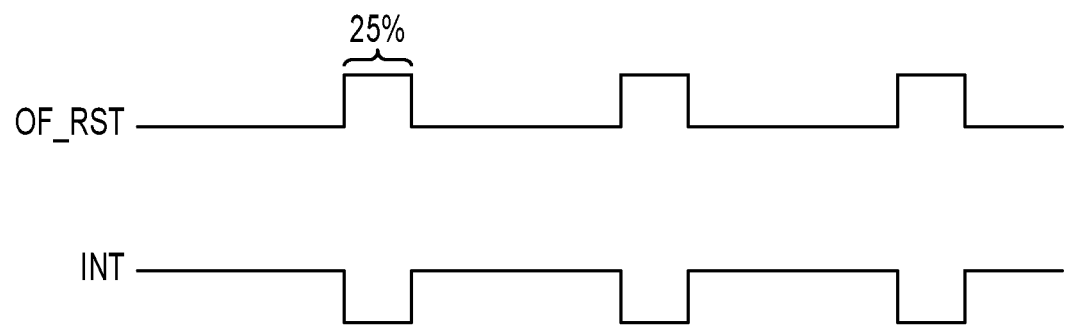
FIG. 6 is a timing diagram showing operation of an illustrative imaging pixel such as the pixel of FIG. 4 when more overflow charge is integrated than disposed of in accordance with an embodiment.

The dynamic range of the pixel may therefore be easily controlled by selecting the amount of time OF_RST is asserted. The more time OF_RST is asserted, the higher the dynamic range of the pixel will be. However, the more time OF_RST is asserted, the worse the signal to noise ratio (SNR) of the sample will be. In FIG. 6, an alternate timing diagram for the OF_RST control signal and INT control signal is shown during the integration period of pixel 34. As shown, when OF_RST is high, INT is low (and vice-versa). The signals may cycle between high and low states at a consistent rate. In FIG. 6, OF_RST is high for 25% of each cycle. For the remaining 75% of the cycle, OF_RST is low (and INT is high). This means that, of the overflow charge received by coupled gate structure 152, 25% is drained to voltage supply 160 and 75% is transferred to storage capacitor Cy. When using the duty cycle of FIG. 6, the pixel will have a lower dynamic range compared to the duty cycle of FIG. 5. However, the pixel will have an improved signal to noise ratio in FIG. 6 compared to FIG. 5.

Reset transistor 158 may be asserted for any desired percentage of time during the integration time of the pixel. The duty cycle may be predetermined or may be updated dynamically by control circuitry in the image sensor (e.g., in response to incident light levels). For example, reset transistor 158 may be asserted more than 95% of the time, more than 90% of the time, more than 75% of the time, more than 65% of the time, more than 50% of the time, more than 40% of the time, more than 30% of the time, more than 20% of the time, more than 10% of the time, more than 5% of the time, less than 95% of the time, less than 90% of the time, less than 75% of the time, less than 65% of the time, less than 50% of the time, less than 40% of the time, less than 30% of the time, less than 20% of the time, less than 10% of the time, less than 5% of the time, between 60% and 90% of the time, between 10% and 40% of the time, etc. Said another way, the time that reset transistor 158 is asserted divided by the time that reset transistor 158 is not asserted (and integration transistor 156 is asserted) may be equal to 1, greater than 1, greater than 2, greater than 3, greater than 4, greater than 10, greater than 20, less than 20, less than 10, less than 0.5, less than 0.1, less than 0.05, more than 0.05, etc.

At the end of the integration time, charge may be present in photodiode 102, storage capacitor 110, and/or storage capacitor 162. Charge from all three locations may therefore be sampled during the readout process. To read out the charge from storage capacitor 162, row select transistor 168 may be asserted (sampling the voltage from storage capacitor 162 onto column output line 116-2). This sampling may occur while transistor 156 is deasserted. Then, to reset capacitor Cy, transistors 156 and 158 may be simultaneously asserted. Once storage capacitor 162 is reset, charge may be transferred from storage capacitor 110 to storage capacitor 162 by asserting transistors 154 and 156. The charge from storage capacitor 162 (which now has the charge originally stored in storage capacitor 110) may then again be sampled by asserting row select transistor 168.

To improve signal-to-noise ratio in the samples, double sampling may be performed. For example, after the charge in storage capacitor 162 is sampled for the first time and storage capacitor 162 is reset, the reset charge level of the storage capacitor may be sampled (e.g., by asserting row select transistor 168). This reset charge level may be subtracted from the first sample of storage capacitor Cy to account for the reset charge level. Then, the charge from storage capacitor 110 is transferred to storage capacitor 162 and sampled. The previously obtained reset charge level may be subtracted from this second sample to correct for the reset charge level. Alternatively, once the second sample is obtained from storage capacitor 162, the storage capacitor 162 may be again reset and a second reset charge level sample may be obtained. The second reset charge level may optionally be used to correct the second sample.

Also during readout, transfer transistor 104 may be asserted to transfer charge from photodiode 102 to floating diffusion region 118. This charge may then be sampled onto column output line 116-1 by asserting row select transistor 114. Correlated double sampling may be performed during this sampling.

If desired, photodiode 102 may be reset by asserting transistors 105, 154, and 158.

Herein, transistors 105 and 154 are used as examples of a structure with a potential barrier that allows charge to overflow the structure when certain charge levels are exceeded. This example is merely illustrative. Other structures may be used to establish this potential barrier if desired.

Additionally, the examples of storage capacitors 110 and 162 for storing charge are merely illustrative. Any desired charge storage region (e.g., a storage diode, storage gate, etc.) may be used in place of storage capacitor 110 and/or storage capacitor 162 if desired.

Figure 7:
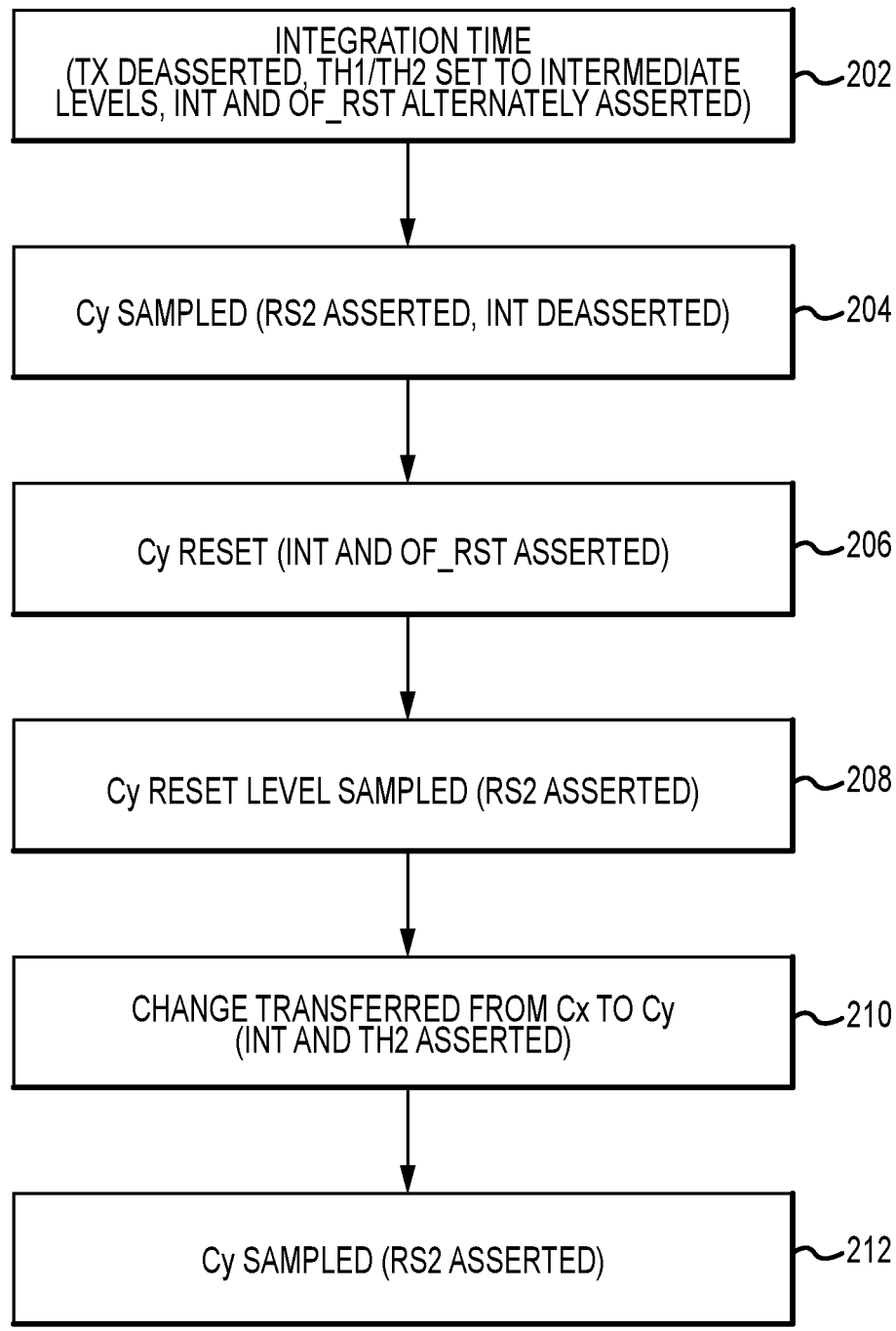
FIG. 7 is a flowchart showing illustrative method steps for operating an imaging pixel with two overflow paths such as the pixel of FIG. 4 in accordance with an embodiment.

FIG. 7 is a flowchart showing illustrative method steps for operating an imaging pixel of the type shown in FIG. 4. At step 202, the pixel may have an integration time. During the integration time, transfer transistor 104 is deasserted, transistors 105 and 154 are set to intermediate levels, and transistors 156 and 158 are alternately asserted and deasserted. During the integration time, photodiode 102 will generate charge in response to incident light. Initially, the charge will accumulate in the photodiode. Once the accumulated charge exceeds a first level (set by TH1), the charge will overflow through transistor 105 into storage capacitor 110 (along path 132 in FIG. 4). If enough charge is generated, the amount of charge in storage capacitor 110 will exceed a second level (set by TH2) and charge will overflow through transistor 154 and pass to node 155 (along path 170 in FIG. 4). At node 155, the charge will either be drained to voltage supply 160 (when transistor 158 is asserted) or integrated and stored at storage capacitor Cy (when transistor 156 is asserted).

At the end of the integration time, the amount of charge at storage capacitor Cy may be sampled in step 204. Transistor 168 may be asserted (while transistor 156 is deasserted) to sample the charge. After sampling the amount of charge at storage capacitor Cy, storage capacitor Cy may be reset at step 206. To reset storage capacitor Cy, transistors 156 and 158 may be simultaneously asserted. Next at step 208, the reset level of storage capacitor Cy may be sampled by asserting transistor 168. After sampling the reset level, charge may be transferred from storage capacitor Cx to storage capacitor Cy at step 210. Transistors 154 and 156 may be asserted to transfer the charge from storage capacitor Cx to storage capacitor Cy. The charge in storage capacitor Cy may then again be sampled at step 212.

Before, during, or after steps 204-212 (e.g., at some point after the integration time is complete), the charge in photodiode 102 may also be sampled. As one example, the floating diffusion region may be reset and the reset charge level of the floating diffusion region may be sampled (by asserting transistor 114). Transfer transistor 104 may then be asserted to transfer charge to the floating diffusion region. The floating diffusion region may then again be sampled.

The steps shown in FIG. 7 are merely illustrative. It should be understood that modifications may be made to these steps as desired. For example, an additional reset sample of storage capacitor Cy may be obtained after step 212 as previously discussed.

Figure 8:
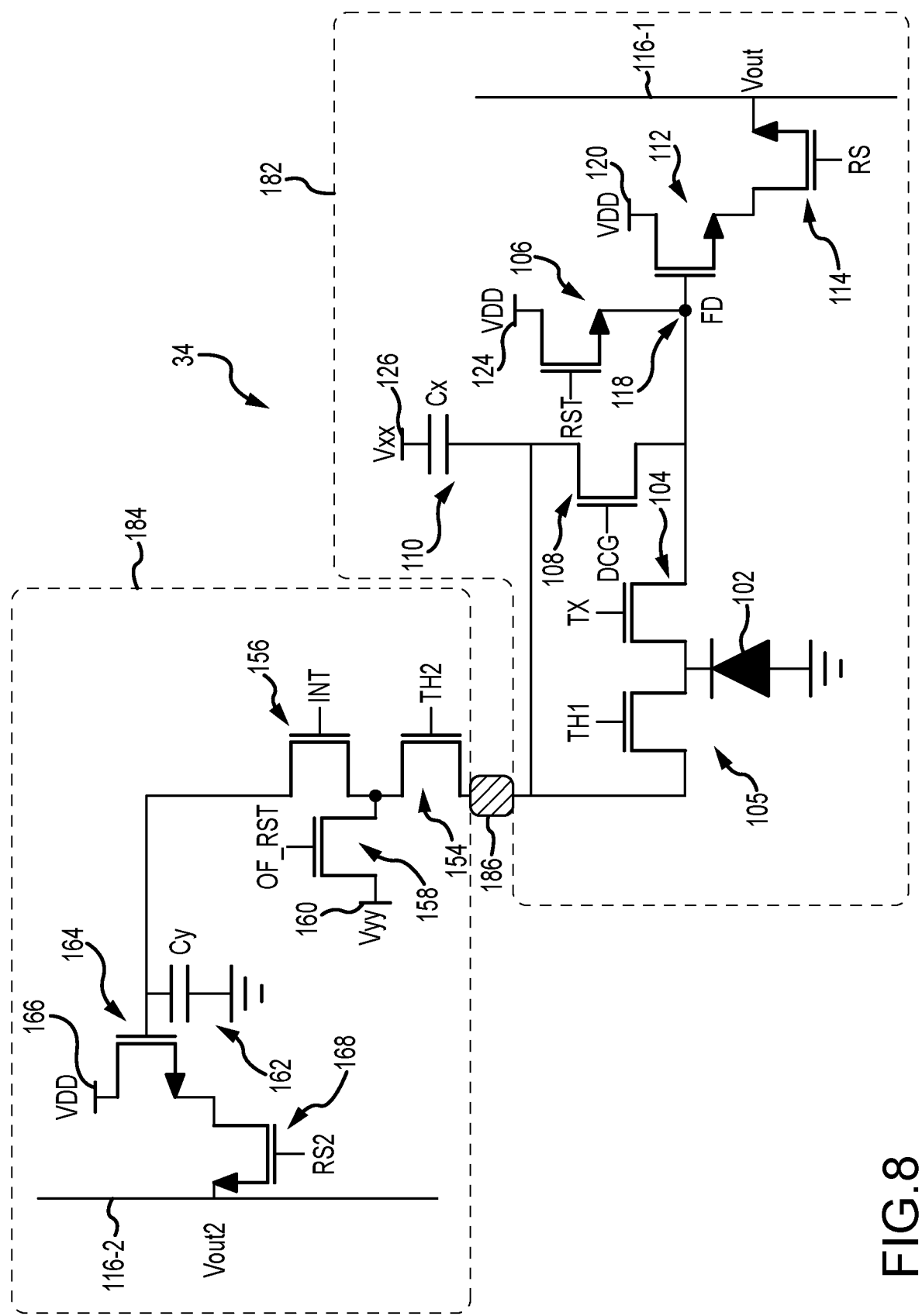
FIG. 8 is a circuit diagram of an illustrative imaging pixel that includes two overflow paths, that is split between two substrates, and that includes a conductive interconnect structure between the two substrates in accordance with an embodiment.

The pixel circuit shown in FIG. 4 is merely illustrative. Other arrangements may be possible that use a coupled gate structure for variable dynamic range improvements. FIG. 8 is a diagram of a pixel 34 that is similar to the pixel of FIG. 4. However, in FIG. 8, pixel 34 includes an additional transistor 108 coupled between storage capacitor 110 and floating diffusion region 118. Transistor 108 may optionally be used to read out charge from storage capacitor Cx using source following transistor 112. Alternatively, charge from storage capacitor Cx may be transferred to storage capacitor Cy and sampled from storage capacitor Cy as previously discussed.

Additionally, FIG. 8 shows how pixel 34 may be split between multiple substrates. In some embodiments, the components of pixel 34 shown in FIG. 8 may be formed in a single substrate (e.g., a semiconductor substrate). To allow more room for photodiode 102 and/or decrease the size of the pixels, pixels 34 may optionally be split between two or more substrates. FIG. 8 shows an illustrative embodiment where a first plurality of the pixel components is formed in substrate 182 (sometimes referred to as semiconductor substrate 182, wafer 182, upper substrate 182, etc.) and a second plurality of the pixel components is formed in substrate 184 (sometimes referred to as semiconductor substrate 184, wafer 184, lower substrate 184, etc.). The first and second substrates may be connected by conductive interconnect layer 186. Interconnect layer 186 may include one or more of a conductive pad, a micro-pad, a conductive interconnect structure, or a conductive via that connects the two substrates. A respective interconnect layer 186 may be included between the two substrates for every pixel in the pixel array.

In FIG. 8, conductive interconnect layer 186 is formed between threshold transistor 154 and threshold transistor 105 (with storage capacitor 110 being formed in substrate 182). This example is merely illustrative. In general, a conductive interconnect layer between the two substrates may be formed at any desired point(s) within the pixel circuit. Two or more interconnect layers may be formed between the first and second substrate within a single pixel. For example, an additional interconnect layer may also be included between floating diffusion region 118 and source follower transistor 112.

In yet another alternative, pixel 34 may be split between three (or more) substrates. For example, transistors 168 and 164 as well as storage capacitor 162 may instead be formed in a third substrate. An additional interconnect layer may couple the third substrate to the second substrate between storage capacitor 162 and transistor 156.

The aforementioned examples are merely illustrative. In general, pixel 34 may be split between any desired number of substrates in any desired manner.

Figure 9:
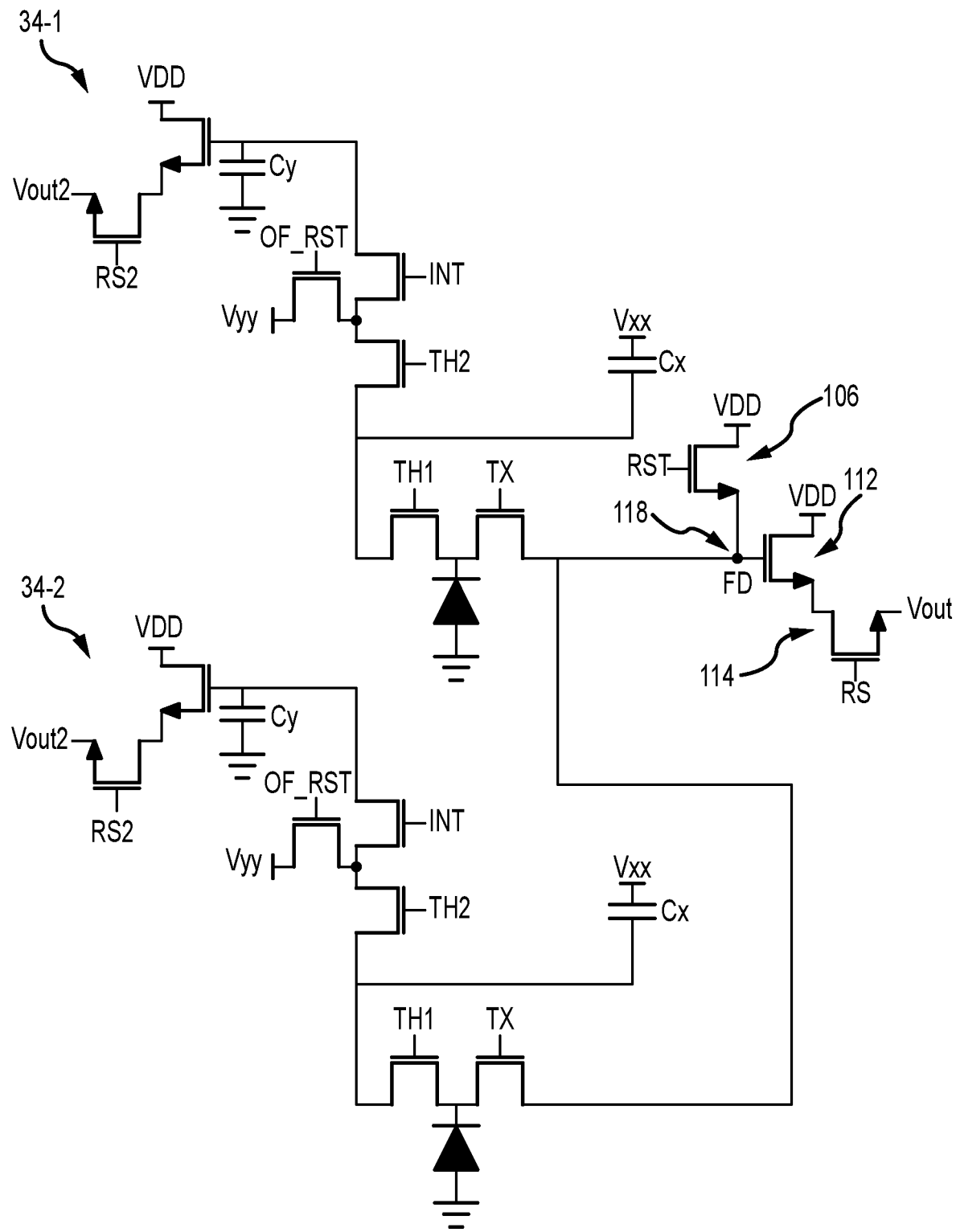
FIG. 9 is a circuit diagram of illustrative imaging pixels with two overflow paths that share a floating diffusion region in accordance with an embodiment.

FIG. 9 is a diagram of pixels that share a floating diffusion region. As shown in FIG. 9, pixel 34-1 includes all of the components of the pixel shown in FIG. 4. Pixel 34-2, however, does not include its own reset transistor 106, source follower transistor 112, or row select transistor 114. Instead, the transfer transistor of pixel 34-2 is coupled to floating diffusion 118 in pixel 34-1. In other words, the floating diffusion region 118 and corresponding readout circuitry are shared between pixels 34-1 and 34-2. Any desired number of pixels (in any desired locations) may share a floating diffusion region and corresponding readout circuitry.

Figure 11:
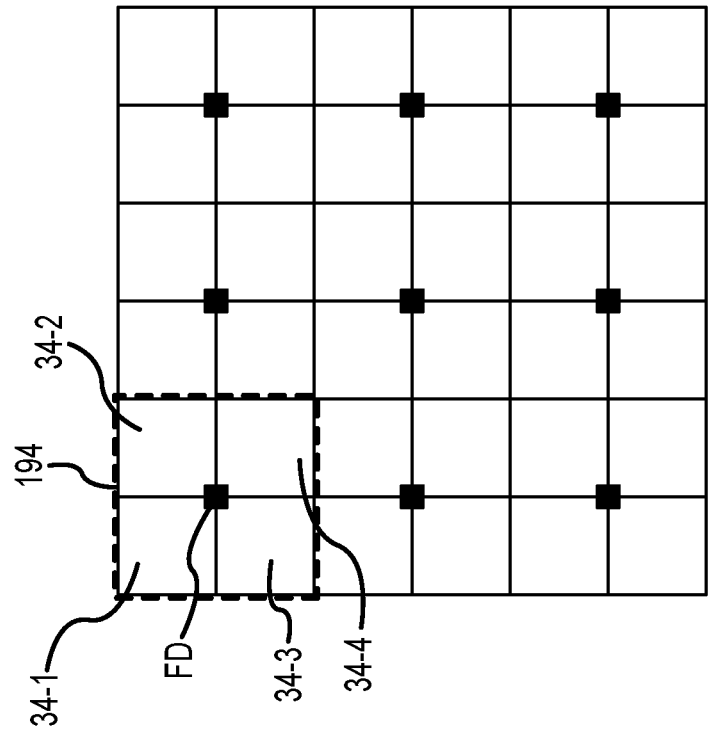
FIG. 11 is a diagram of an illustrative pixel array showing how every four pixels may share a floating diffusion region in accordance with an embodiment.
Figure 10:
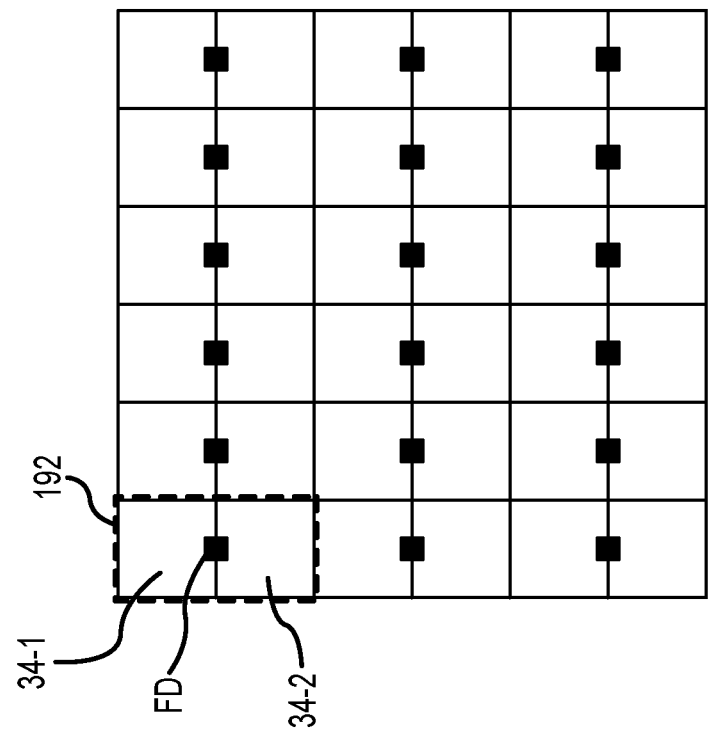
FIG. 10 is a diagram of an illustrative pixel array showing how every two pixels may share a floating diffusion region in accordance with an embodiment.

FIGS. 10 and 11 show illustrative sharing arrangements for pixels in the pixel array. In FIG. 10, 1×2 groups 192 of pixels (with 2 adjacent pixels in a single column and two rows) each share a single floating diffusion region. As shown in FIG. 10, pixels 34-1 and 34-2 share floating diffusion region FD (and corresponding readout circuitry). FIG. 11 shows an alternate arrangement where 2×2 groups 194 of pixels (with 4 adjacent pixels in two columns and two rows) each share a single floating diffusion region. As shown in FIG. 11, pixels 34-1, 34-2, 34-3, and 34-4 share a floating diffusion region FD (and corresponding readout circuitry). These arrangements are merely illustrative. Any desired number of pixels (e.g., two, three, four, more than four, nine, more than nine, etc.) may share a single floating diffusion region. The pixels may be horizontally adjacent (e.g., in the same row), may be vertically adjacent (e.g., in the same column), may be diagonally adjacent (e.g., as pixels 34-1 and 34-4 in FIG. 11), or may not be adjacent (e.g., with an intervening pixel that does not share the floating diffusion region).

When two or more pixels share a floating diffusion region, the charge from the two pixels may be readout individually or cumulatively. For example, charge from two or more pixels may be transferred to the floating diffusion region (e.g., binned) and read out as a single signal. Alternatively, charge from a first pixel may be read out using the floating diffusion region. Then, charge from a second pixel may be subsequently read out using the floating diffusion region. This allows the sensor to operate in either a binning mode (with lower resolution but higher light sensitivity) or a normal mode (with higher resolution).

The foregoing is merely illustrative of the principles of this invention and various modifications can be made by those skilled in the art. The foregoing embodiments may be implemented individually or in any combination.

What is claimed is:

1. An imaging pixel comprising:
   a photodiode;
   a floating diffusion region;
   a transfer transistor coupled between the photodiode and the floating diffusion region;
   a first charge storage region configured to receive a first overflow portion of charge from the photodiode;
   a second charge storage region;
   a bias voltage supply terminal; and
   one or more transistors interposed between the first charge storage region and the second charge storage region, wherein the one or more transistors are configured to alternate between transferring a second overflow portion of the charge from the photodiode to the second charge storage region and draining the second overflow portion to the bias voltage supply terminal, wherein charge exceeding a first given level overflows from the photodiode to the first charge storage region, and wherein charge exceeding a second given level overflows from the photodiode through at least one of the one or more transistors.

2. The imaging pixel defined in claim 1, further comprising:
   a first source follower transistor coupled to the floating diffusion region; and
   a second source follower transistor coupled to the second charge storage region.

3. The imaging pixel defined in claim 1, wherein the one or more transistors comprises a first transistor, a second transistor that is coupled between the first transistor and the second charge storage region, and a third transistor that is coupled between the first transistor and the bias voltage supply terminal.

4. The imaging pixel defined in claim 3, wherein the second transistor is configured to be asserted when the third transistor is deasserted and wherein the second transistor is configured to be deasserted when the third transistor is asserted.

5. The imaging pixel defined in claim 3, further comprising:
   a fourth transistor that is interposed between the photodiode and the one or more transistors.

6. The imaging pixel defined in claim 1, wherein the first charge storage region is a first storage capacitor and the second charge storage region is a second storage capacitor.

7. The imaging pixel defined in claim 1, further comprising:
   an additional transistor that is interposed between the floating diffusion region and the first charge storage region.

8. An image sensor comprising:
   a plurality of photodiodes including a first photodiode and a second photodiode;
   a floating diffusion region coupled to each of the plurality of photodiodes via a corresponding transfer transistor;

a first charge storage region configured to receive a first overflow portion of charge from the first photodiode;
a second charge storage region configured to receive a second overflow portion of the charge from the first photodiode;
a third charge storage region configured to receive a first overflow portion of charge from the second photodiode;
a fourth charge storage region configured to receive a second portion of the charge from the second photodiode;
a first source follower transistor coupled to the floating diffusion region; and
a second source follower transistor coupled to the second charge storage region.

9. The image sensor defined in claim 8, further comprising:
first charge directing transistors interposed between the first photodiode and the second charge storage region; and
second charge directing transistors interposed between the second photodiode and the fourth charge storage region.

10. The image sensor defined in claim 9, wherein the first charge directing transistors comprise a first transistor, a second transistor that is coupled between the first transistor and the second charge storage region, and a third transistor that is coupled to the first transistor, wherein the image sensor further comprises a fourth transistor coupled between the first transistor and the first photodiode, wherein the second charge directing transistors comprise a fifth transistor, a sixth transistor that is coupled between the fifth transistor and the fourth charge storage region, and a seventh transistor that is coupled to the fifth transistor and wherein the image sensor further comprises an eighth transistor coupled between the fifth transistor and the second photodiode.

11. The image sensor defined in claim 10, wherein the fourth transistor is coupled between the first photodiode and the first charge storage region and wherein the eighth transistor is coupled between the second photodiode and the third charge storage region.

12. The image sensor defined in claim 8, further comprising:
a third source follower transistor coupled to the fourth charge storage region.

13. An imaging pixel comprising:
a first semiconductor substrate comprising:
a photodiode;
a floating diffusion region; and
a first charge storage region configured to receive charge from the photodiode;
a second semiconductor substrate comprising:
a second charge storage region configured to receive charge from the photodiode;
one or more transistors interposed between the first charge storage region and the second charge storage region, wherein the one or more transistors are in the first semiconductor substrate or the second semiconductor substrate; and
a conductive interconnect between the first semiconductor substrate and the second semiconductor substrate.

14. The imaging pixel defined in claim 13, wherein the one or more transistors are in the second semiconductor substrate.

15. The imaging pixel defined in claim 13, further comprising:
a transfer transistor in the first semiconductor substrate that is coupled between the photodiode and the first charge storage region;
a first source follower transistor in the first semiconductor substrate coupled to the floating diffusion region; and
a second source follower transistor in the second semiconductor substrate coupled to the second charge storage region.

16. The imaging pixel defined in claim 13, further comprising:
an additional transistor that is interposed between the photodiode and the one or more transistors.

17. The imaging pixel defined in claim 16, wherein the conductive interconnect is interposed between the one or more transistors and the additional transistor.

18. The imaging pixel defined in claim 16, wherein the additional transistor is a first transistor that is interposed between the photodiode and the first charge storage region, and wherein the imaging pixel further comprises:
a second transistor that is interposed between the floating diffusion region and the first charge storage region.

19. The imaging pixel defined in claim 13, where the one or more transistors are configured to transfer at least some of the charge from the first charge storage region to the second charge storage region.

* * * * *